United States Patent [19]
Gruenenfelder et al.

[11] Patent Number: 5,688,381
[45] Date of Patent: Nov. 18, 1997

[54] MAGNETRON ATOMIZATION SOURCE AND METHOD OF USE THEREOF

[75] Inventors: Pius Gruenenfelder, Wangs; Hans Hirscher, Bad Ragaz; Urs Schwendener, Buchs; Walter Haag, Grabs, all of Switzerland

[73] Assignee: Balzers Aktiengesellschaft, Liechtenstein, Liechtenstein

[21] Appl. No.: 417,854

[22] Filed: Apr. 7, 1995

[30] Foreign Application Priority Data

Apr. 7, 1994 [EP] European Pat. Off. ............. 94105388

[51] Int. Cl.⁶ ................................................ C23C 14/34
[52] U.S. Cl. ..................... 204/192.12; 204/298.11; 204/298.18
[58] Field of Search ................... 204/192.12, 192.2, 204/298.18, 298.19, 298.11

[56] References Cited

U.S. PATENT DOCUMENTS

| | | | |
|---|---|---|---|
| 5,080,772 | 1/1992 | Hurwitt et al. | 204/298.18 X |
| 5,112,467 | 5/1992 | Zejda | 204/298.11 X |
| 5,164,063 | 11/1992 | Braeuer et al. | 204/298.11 |
| 5,174,875 | 12/1992 | Hurwitt et al. | 204/298.18 X |
| 5,330,632 | 7/1994 | Sichmann | 204/298.18 |
| 5,334,302 | 8/1994 | Kubo et al. | 204/298.18 |

FOREIGN PATENT DOCUMENTS

| | | |
|---|---|---|
| 0 311 697 A2 | 4/1989 | European Pat. Off. |
| 0 330 445 | 8/1989 | European Pat. Off. |
| 24 31 832 A1 | 1/1975 | Germany. |
| 40 18 914 C1 | 6/1991 | Germany. |

*Primary Examiner*—Nam Nguyen
*Attorney, Agent, or Firm*—Evenson, McKeown, Edwards & Lenahan, P.L.L.C.

[57] ABSTRACT

For optimizing the yield of atomized-off material on a magnetron atomization source, a process space, on the source side, is predominantly walled by the atomization surface of the target body. The magnetron atomization source has a target body with a mirror-symmetrical, concavely constructed atomization surface with respect to at least one plane and a magnetic circuit arrangement operable to generate a magnetic field over the atomization surface. The magnetic circuit arrangement includes an anode arrangement, a receiving frame which extends around an edge of the target body and is electrically insulated with respect thereto. The receiving frame has a receiving opening for at least one workpiece to be coated. The magnetron source can be used to provide storage disks, such as CDs, with an atomization coating.

32 Claims, 2 Drawing Sheets

MAGNETRON ATOMIZATION SOURCE AND METHOD OF USE THEREOF

BACKGROUND AND SUMMARY OF THE INVENTION

The present invention relates to a magnetron atomization source having a target body with a mirror-symmetrical, concavely constructed atomization surface with respect to at least one plane, a magnetic circuit arrangement operable to generate a magnetic field over the atomization surface, including an anode arrangement, a receiving frame which extends around an edge of the target body and is electrically insulated with respect thereto, which receiving frame has a receiving opening for at least one workpiece to be coated, and on the side of the source, a process space bounded essentially by the atomization surface of the target body and a surrounding non-atomized residual interior surface of the receiving frame. Moreover, the present invention relates to a method of use thereof in which storage disks, such as CDs, are provided with an atomization coating.

Magnetron atomization sources are generally described in DE-OS-24 31 832; EP-A-0 330 445; EP-A-0 311 697; U.S. Pat. No. 5,164,063; and DE-PS-40 18 914.

DE-PS-35 06 227 describes an improved magnetron atomization source which has one or two target bodies forming a centrically mirror-symmetrically concavely constructed atomization surface. A workpiece which, in top view, has a significantly smaller diameter than the diameter of the cup-shaped target body is inserted by way of a holding device for the purpose of atomization coating. Magnetic circuits, which are an arrangement of active elements such as permanent magnets and/or electromagnets, as well as of passive elements such as ferromagnetic elements, for example, of iron yoke parts and air gaps are provided to generate a magnetic field of the type basically known in the case of magnetrons. The magnetic circuits operate separately for the bottom area of the atomization surface and its arched edge area, respectively.

DE-A-28 24 289 describes the atomization surface of a target body on a magnetron atomization source in a centrically concave manner and an earth shielding frame in the edge area of the target body. With respect to the target body, the anode is arranged centrically and is cooled by a medium. In this source, a workpiece to be coated is generally arranged above the illustrated source. That is, the workpiece is arranged above the earth shielding frame which surrounds the edge of the target body.

EP-A-0 393 957 discloses a magnetron atomization source which has a centrically concavely shaped-in atomization surface of the target body. A workpiece to be atomization-coated is arranged far away from the source.

In many cases and specifically also in the case of the use of the magnetron atomization surface preferred according to the present invention for the coating of storage disks, for example, of optical storage disks (such as magneto-optical disks), video disks or audio disks (such as compact disks), short coating times with long service lives of the used target bodies must be achieved. This requirement has the effect, among other things, that as a high proportion as possible of the material atomized from the atomization source is deposited as a coating material on the workpiece surface to be coated.

Known atomization sources of the type mentioned above have a disadvantage, however, that, because of, among other things, the large surfaces which are neither an atomization surface of the atomization source nor a surface of a workpiece to be usefully coated, a relatively high percentage of the material atomized from the atomization surface of the target is uselessly deposited on other surfaces defining the process space. This useless deposition drastically reduces the above-mentioned yield, and significantly reduces the coating speed as well as the service life of a target body. As a result, per target body fewer workpieces can be coated with the given layer thickness.

In addition, more cleaning intervals are required in order to ensure operational reliability, and higher operating power is required to implement desired rates. In turn, thermal stress to the source and to the workpieces is increased. All of the foregoing has a negative effect on the efficiency of a production system.

The above-mentioned disadvantages also apply to the magnetron atomization source described in DE-A-42 02 349 which has a centrically concavely constructed target body, a magnetic circuit arrangement which generates a magnetic field above the atomization surface, an anode arrangement, and a receiving frame which surrounds the edge of the target body and is electrically insulated with respect to it and has a receiving opening for a workpiece disk to be coated. In this known source, the process space is defined essentially by the atomization surface of the target body and the interior surface of the receiving frame. During operation, the process space is closed off by the workpiece disk placed on the receiving opening of the receiving frame.

Considering the fact that the conventional receiving frame, as an example of a surrounding non-atomized residual interior surface, extends on the outside around the edge of the target body, the length of the cut of the interior frame surface already visible in the cross-section results in a large ring surface which is neither usefully atomized nor usefully coated. It is not significantly smaller than the new atomization surface of the target body but larger than the surface of the receiving opening. Thus, although a high percentage of the walls bounding the interior surface of the process space are coated, they are not usefully coated, thereby still causing lower efficiency.

It is an object of the present invention to eliminate the above-mentioned disadvantages and to improve efficiency. This object has been achieved in a magnetron atomization source in accordance with the present invention by providing that the process space, apart from the receiving opening for the at least one workpiece, is bounded essentially by the atomization surface, and reducing the surrounding non-atomized residual interior surface to a respective minimum which, during atomization operation, ensures a stable plasma discharge.

As a result of the fact that, according to the present invention, the atomization surface of the target body essentially defines the process space, apart from the workpiece placed during the operation, a significant improvement of the ratio between the atomized-off material quantity and the material quantity deposited as a layer on the workpiece or the workpieces is achieved and results in a significant efficiency increase.

Preferred surface ratios are obtained according to the present invention by providing that the relationship of the residual interior surface, such as that of the receiving ring, and that of the atomization surface of the target body are such the former is less than or equal to 50% of the latter.

BRIEF DESCRIPTION OF THE DRAWINGS

These and other objects, features and advantages of the present invention will become more readily apparent from the following detailed description when taken in conjunction with the accompanying drawings wherein.

DETAILED DESCRIPTION OF THE DRAWINGS

Figure 1:
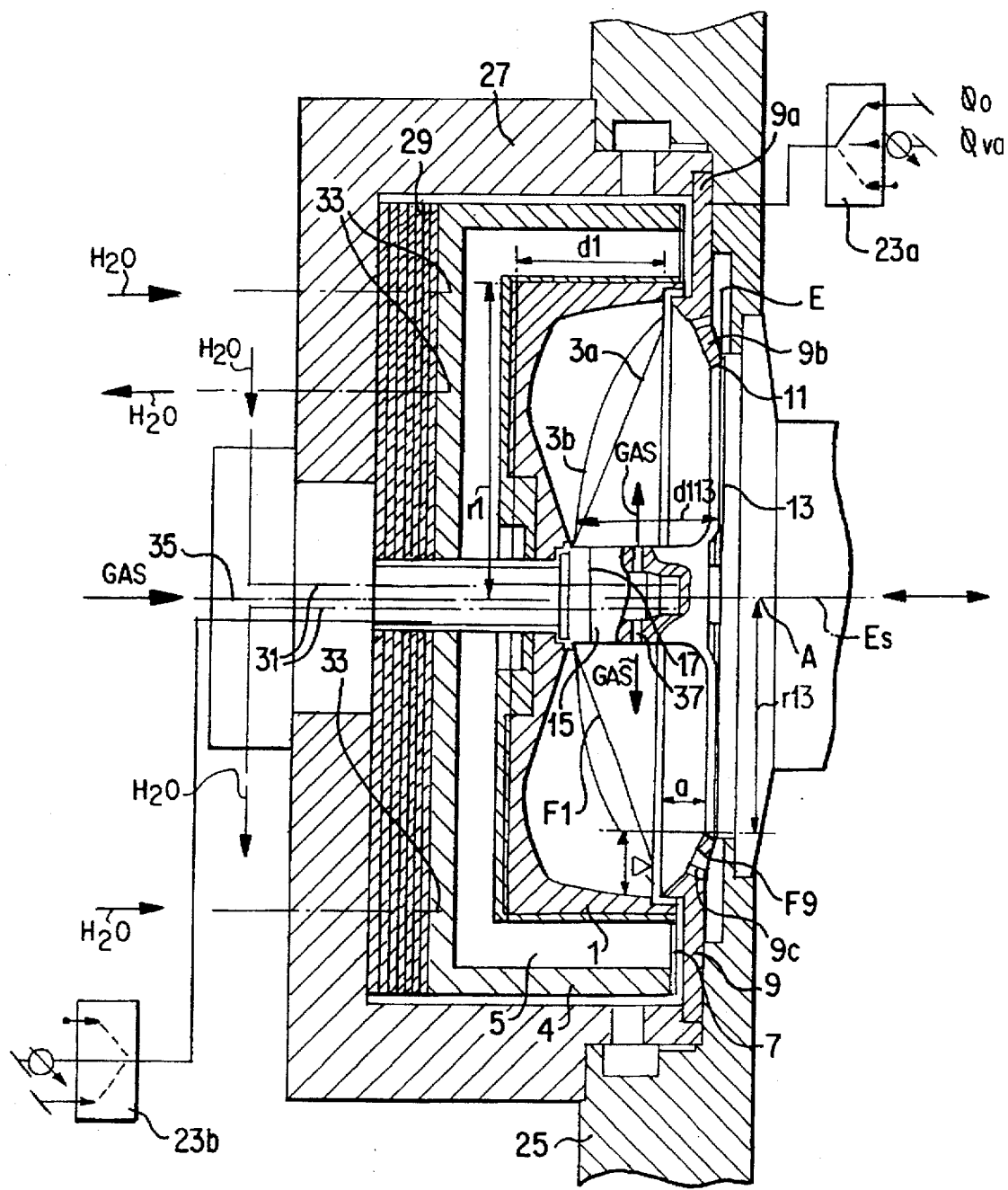
FIG. 1 is cross-sectional schematic view of a currently preferred embodiment of magnetron atomization source according to the present invention.

Referring now to FIG. 1, the magnetron atomization source according to the present invention comprises a target body 1 having, in a new condition, a conical atomization surface 3a, or a concave mirror shape 3b, preferably in the shape of a calotte shell, so that, already in its new condition with an atomization surface $F_1$, the target body 1 is significantly thicker at the edge than in the center. Although in the illustrated preferred embodiment the target 1 is circular in top view (not shown) and therefore its concave shaped-in portion is rotationally symmetrical, the target body 1 and the following constructional elements of the source to be described later may, for certain uses, be constructed to be symmetrical with respect to a single plane or to two planes. The target body 1 and therefore the additional construction elements of the source preferably define a rectangular magnetron source or an elliptical or generally oval or, in the illustrated, preferred embodiment, a circular magnetron source.

In the illustrated circular magnetron source, the maximal thickness, $d_1$, of the target body 1 on its edge amounts to approximately 50% of the target radius $r_1$. The target body 1 is embedded in a ferromagnetic cup-shaped magnetic circuit housing 4 which defines a cup-shaped magnet receiving space 5 which encloses the target body 1 on the base side and on its upward-projecting lateral surfaces. A surrounding receiving frame 9 is provided along the edge of the target body 1 and of the circular-ring-shaped end face 7 of the magnetic circuit housing 4 and is electrically insulated from the target body 1 as well as the housing 4 at a dark space distance. The interior surface $F_9$ of the receiving frame 9 projects in a sloped manner from the edge of the target body 1 against the center axis A of the source inward and defines a receiving opening 11 for a circular workpiece disk 13. In the illustrated embodiment, the ratio of the surface $F_9$ to the new atomization surface $F_1$ is:

$$F_9 \leq 30\% \ F_1.$$

The circular workpiece disk 13 is preferably a dielectric or metallic workpiece disk, preferably the body of a storage disk to be coated, such as a magneto-optical storage disk, a video disk, an audio disk such as a compact disk or CD. The periphery of the disk 13 rests at the edge of the receiving opening 11 on the receiving frame 9 which, particularly in the case of CD processing, forms the peripheral masking element in order to prevent an atomization coating at the edge of the disk and to obtain a transition which is as sharp as possible from the coated surface to the uncoated edge.

The center of the target body 1 can be penetrated by a core 15, which is electrically insulated with respect thereto which, however, is not necessary for implementing the source according to the present invention. For CD-coating and for coating most other optical storage disks, the core 15 extends to the level of the receiving opening plane E in order to mask the center of the workpiece disk 13. If unnecessary for masking or the like, the core 15, as indicated by the end surface 17, may be reduced in height or eliminated completely.

The target body 1 is placed by the magnetic circuit housing 4 on a negative cathodic potential. As indicated schematically by the selection units 23a, 23b, the core 15 as well as the receiving ring 9 can be applied to the anode, such as the ground potential $\Phi_0$ or to adjustable or fixedly given other reference potentials $\Phi_v$, or can each be operated in a floating manner. Preferably, the core 15 and the ring 9 are applied to anodic potentials.

As illustrated, for example, by the insulation ring 9c, two or more parts 9a, 9b can constitute the receiving frame 9 and optionally be operated electrically in different ways. For example, an anodic potential can be applied to part 9a, and part 9b can be operated in a floating manner.

In the case of a circular workpiece disk 13 with a radius $r_{13}$, corresponding to a diameter $\phi_{13}=2r_{13}$, the following dimensioning of the maximal distance of the new atomization surface to the disk surface $d_{113}$ to be coated has proven to be excellent:

$$d_{113} \geq 20\% \ \phi_{13},$$

wherein the distance $d_{113}$, particularly in the case of normal pressure conditions of $10^{-3}$ to $10^{-1}$ mbar during atomization coating, should not significantly fall below 25 mm.

Furthermore, the following dimensioning will preferably apply: generally, $d_{113} \leq 50\% \ \phi_{13}$, but preferably: $d_{113} \leq 42\% \ \phi_{13}$, and, most preferably, $d_{113} \leq 35\% \ \phi_{13}$.

The foregoing dimensioning is particularly true for the processing of circular-disk-shaped workpieces of diameters of from 50 mm to 150 mm, particularly 75 mm to 150 mm. If, however, the workpieces to be coated are not of circular-disk-shape but, for example, are oval or rectangular, the indicated dimensioning directions with apply relative to the smallest diameter $\phi_k$ of the respective workpiece. Furthermore, it has been found to be preferable, particularly for CD-coating according to FIG. 1, that the target body radius $r_1$ is 30% to 40% larger than the radius $r_{13}$ of the workpiece disk 13 to be coated.

The interior surface $F_9$ of the receiving ring 9 which is minimized in a sloped manner and which is neither usefully atomized nor usefully coated and, with respect to plasma technology, ensures the discharge stability in the edge area between the disk periphery and the target body edge, is preferably configured according to the following dimensioning directions:

The distance $\Delta$, which is perpendicular with respect to the axis A or generally with respect to a plane of symmetry $E_S$ and is bridged or spanned by the surface $F_9$, amounts, relative to the diameter $\phi_{13}$ of a circular disk 13 or, more generally, with respect to the smallest diameter $\Phi_k$ of a non-circular disk, as defined above, to, generally a $\Delta \leq 20\% \ \phi_{13}$, but preferably to a $\Delta \leq 10\% \ \phi_{13}$, and currently is most preferably dimensioned at $\Delta \approx 15\% \ \phi_{13}$.

It is also definitely possible to select the distance $\Delta$ to be zero. That is, the interior surface $F_9$ is configured to have only components parallel to the axis A or the plane $E_S$.

The distance, a, bridged or spanned by the interior surface $F_9$, parallel to the axis A or the plane ES, irrespective of whether $\Delta$ is or is not larger than zero, and relative to the distance $d_{113}$ between the new atomization surface center and the disk surface to be coated, amounts to, generally, $0 \leq a \leq 50\% \ d_{113}$, but preferably to $0 \leq a \leq 40\% \ d_{113}$, and is currently most preferably dimensioned at $a \approx 30\% \ d_{113}$.

Furthermore, a system-side flange 25 is provided for mounting the source according to the present invention. An electric insulation 29 is provided between a source housing 27 with the flange 25 and the magnetic circuit/target body arrangement comprising the housing 4 and the target body 1.

In addition, as illustrated schematically, the centric core 15 is medium-cooled, preferably water-cooled, by way of a pipe system 31. The cooling of the receiving frame 9 takes place by way of the flange 25.

The cathode/anode discharging distance may be operated by an AC- and DC-mixed supply, for example, by a timed DC, or may be operated only by DC. Layers may be deposited reactively or non-reactively, preferably from electrically conducting target body material. As also illustrated diagrammatically by the pipe system 33, the magnetic circuit housing 4 and the target body 1 are medium-cooled, preferably water-cooled.

A working gas (for non-reactive atomization coating, this gas may be a noble gas or for reactive atomization coating, this gas may be a noble gas with a reactive gas, the latter reacting with the material atomized from the target body 1, and the coating taking place by a reaction product) is preferably discharged by a schematically illustrated pipe system 35 in the core 15 via outlet openings 37 into the process space as shown by the radially directed arrows.

Figure 2:
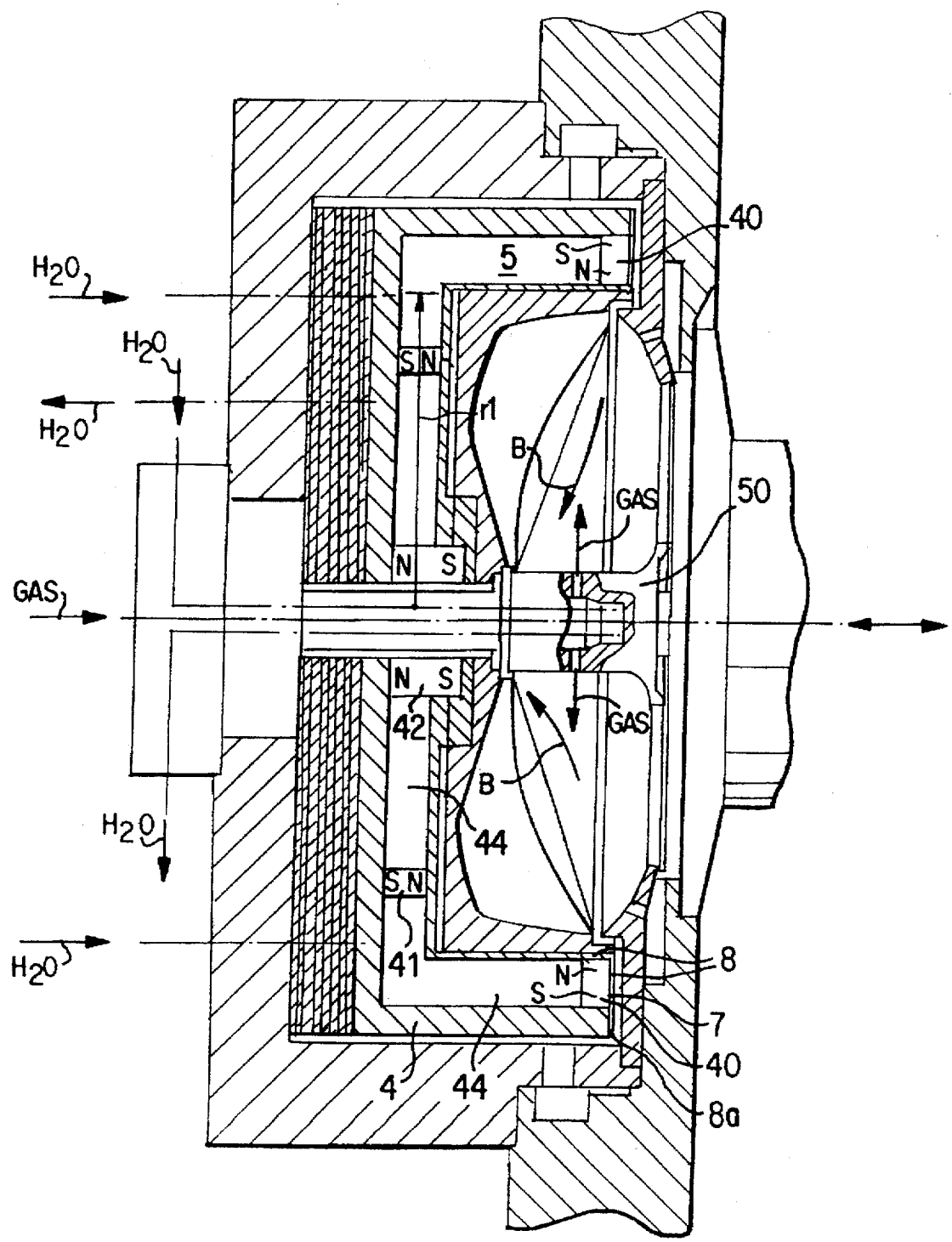
FIG. 2 is a view similar to FIG. 1 but supplemented with magnetic circuits.

In FIG. 2, which for reasons of clarity is the same representation as FIG. 1, a currently preferably implementing magnetic circuit is entered in the housing 4. A ring of permanent magnets 40 is arranged in the area of the face 7 of the ferromagnetic housing 4. In the center and approximately on half the radius, $r_1$, of the atomization surface, additional permanent magnet rings 42 and 41 are provided.

As indicated, the polarities of the ring magnets are selected such that, qualitatively, the magnetic field B illustrated in FIG. 2 is created above the atomization surface and essentially, as the atomization increases, maintains the same strength and the same direction with respect to the momentary atomization surface. Naturally, it is also easily possible, for example, by way of a mechanical following of the magnet ring 40 and/or 41, to cause the magnetic field during the atomization to follow the respective momentary atomization surface in an optimized manner. The face 7 is covered by a layer 8 of a non-ferromagnetic material (for example, an insulating material), such as a high-temperature resistant and vacuum-suitable plastic material. This layer 8 is, on the side, disposed against the dark space 8a and, on the other side, above the one magnetic pole N. As a result, parasitic plasma discharges and flashovers, which may be triggered in the dark space by strong magnetic fields, are prevented.

With the magnetic field B constructed according to the present invention, it is also ensured that, also at the edge of the target body 1, an atomization removal takes place as much as possible to largely prevent an atomization accumulation there. Also, in the center of the target body 1, the zone in which no atomization removal takes place, also the amount of the atomized-on material is minimized.

The active elements 40, 41, 41 provided in the hollow space 5 and the non-active elements, such as the iron housing 4 and the geometrical arrangement with its air gaps 44, contribute significantly to the construction of the magnetic field B of FIG. 2.

Because the receiving frame 9 shown in FIG. 1 can be electrically operated arbitrarily within wide ranges, and a center masking can be implemented also by a center mask 50, without providing a core 15, it is now possible with certainty to bring the frame 9 implementing the edge masking in a changed construction and/or the center mask 50, as explained in detail in German Patent Application 42 35 678, together with the workpiece disk in the respective coating position.

With a magnetron sputter source implemented as shown in the example, having a target diameter of 160 mm, a substrate diameter of 120 mm, a target/substrate distance $d_{113}$ of 35 mm, a new atomization surface shape: concave, spherical shell with r=80 mm, a power supply of 15 kW, permanent magnets made of neodymium, ferrite, a pressure of approx. $10^{-2}$ mbar, and a target material of Al (Mg, Si, Mn) service lives of 80,000 coated CDs were achieved, corresponding to 220 kWh.

The specific coating rate, defined as the coating rate per power unit (kW), in the case of the new atomization surface, amounted to 7 nm/kWs and, at the end of the service life, was still 4.5 nm/kWs. The coating was carried out with a thickness of 55 nm. Here, 52% of the material atomized off the target body arrived as coating material on the workpiece disks. The outer edge zone of the target body, which was not atomized off, amounted to 3 mm. In the center, this zone amounted to less than 1 mm, usually 0 mm. In these zones, the maximal atomization quantity during the target life or service life amounted to approximately 500 μm.

Thus, with the magnetron source according to the present invention, a high average coating rate is achieved with long service lives while the surface coating is perfectly uniform and has high efficiency, whether defined as a coating quantity per atomized material quantity or as a layer quantity per electric energy unit, in which case all process parameters can be maintained essentially constant during the service life of the target body. The specific coating rate was increased virtually to a factor of 2 compared with known sources.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A magnetron atomization chamber, comprising a target body having, in a new condition an atomization surface, $F_1$, constituting a mirror-symmetrical concave surface constructed with respect to at least one plane, a magnetic circuit arrangement operable to generate a magnetic field over the atomization surface, including an anode arrangement, a receiving frame which extends around an edge of the target body and is electrically insulated with respect thereto, which receiving frame has a receiving opening for at least one workpiece to be coated, and the atomization surface and a surrounding non-atomized residual interior surface of the receiving frame being sized and arranged relative to one another such that a process space bounded substantially by the atomization surface of the target body and the surrounding non-atomized residual interior surface, $F_9$, of the receiving frame, except for the receiving opening for the at least one workpiece, satisfies the relationship, $F_9 \leq 50\% \ F_1$, to minimize the surrounding non-atomized residual interior surface and thereby to ensure, during an atomizing operation, a stable plasma discharge.

2. The source according to claim 1, wherein $F_9 \leq 40\% \ F_1$.

3. The source according to claim 1, wherein $F_9 \leq 30\% \ F_1$.

4. The source according to claim 1, wherein the magnetic circuit arrangement is configured to be switchable to an electric potential of the target body.

5. The source according to claim 1, wherein the atomization surface in a new state is constructed as one of a paraboloid and spherical surface with respect to the receiving opening.

6. The source according to claim 1, wherein the atomization surface is one of circular, oval and rectangular in plan view.

7. The source according to claim 1, wherein the magnetic circuit arrangement is configured to maintain the atomization surface in a concave, continuously curved construction, during the atomizing operation.

8. The source according to claim 1, wherein the magnetic circuit arrangement is constructed such that a directional characteristic with respect to atomized-off particles of the atomization surface with respect to the receiving opening is essentially maintained during the atomizing operation.

9. The source according to claim 1, wherein, for coating a workpiece disk having a center to be covered, a masking core projects centrally through the target body to a level of the receiving opening.

10. The source according to claim 1, wherein gas outlets are arranged centrally with respect to the atomization surface to supply a process gas.

11. The source according to claim 1, wherein a distance between the atomization surface in a new state and a plane of the receiving opening with respect to a diameter, $\Phi_k$, of the receiving opening is 20% $\Phi_k \leq d_{113}$.

12. The source according to claim 11, wherein the receiving opening is circular and has a diameter of between 50 mm to 150 mm.

13. The source according to claim 11, wherein the diameter is between 75 mm to 150 mm.

14. The source according to claim 1, wherein the distance between the atomization surface in a new state and a plane of the receiving opening with respect to the diameter, $\Phi_k$, of the receiving opening is $d_{113} \leq 50\%$ $\Phi_k$.

15. The source according to claim 14, wherein $d_{113} \leq 42\%$ $\Phi_k$.

16. The source according to claim 14, wherein $d_{113} \leq 35\%$ $\Phi_k$.

17. The source according to claim 1, wherein the distance between the atomization surface in a new state and a plane of the receiving opening is at least 25 mm.

18. The source according to claim 17, wherein the distance is between 30 mm and 55 mm.

19. The source according to claim 17, wherein the distance is between 30 mm and 35 mm.

20. The source according to claim 1, wherein a diameter of the atomization surface is between 30% and 40% larger than a diameter of the receiving opening.

21. The source according to claim 1, wherein, for circular workpiece disks, the receiving frame is parallel to a plane of the receiving opening and has a width, $\Delta$, of $0 \leq \Delta \leq 10\%$ $\Phi_k$, wherein $\Phi_k$ is the smallest workpiece diameter.

22. The source according to claim 21, wherein the width is $0 \leq \Delta \leq 20\%$ $\Phi_k$.

23. The source according to claim 21, wherein the width is approximately 15% $\Phi_k$.

24. The source according to claim 1, wherein the residual interior surface of the receiving frame perpendicular to a plane of the receiving opening has a depth, a, which, with respect to a maximal distance, $d_{113}$, between the atomization surface and the opening plane of the receiving opening, is dimensioned as a $\leq 50\%$ $d_{113}$.

25. The source according to claim 24, wherein a $\leq 40\%$ $d_{113}$.

26. The source according to claim 24, wherein a $\approx 30\%$ $d_{113}$.

27. The source according to claim 1, wherein at least a portion of the receiving frame is one of applied to a reference potential and is operated in a floating manner.

28. The source according to claim 27, wherein the reference potential is variable.

29. The source according to claim 27, wherein the reference potential is anodic.

30. The source according to claim 1, wherein a coating rate during service life of the target body decreases by less than 50% of an initial rate.

31. The source according to claim 1, wherein an electric insulation is provided at least one high magnetic field intensity location to prevent discharges.

32. A method of using an atomization chamber comprising a target body having, in a new condition an atomization surface, $F_1$, constituting a mirror-symmetrical concave surface constructed with respect to at least one plane, a magnetic circuit arrangement operable to generate a magnetic field over the atomization surface, including an anode arrangement, a receiving frame which extends around an edge of the target body and is electrically insulated with respect thereto, which receiving frame has a receiving opening for at least one workpiece to be coated, and the atomization surface and a surrounding non-atomized residual interior surface of the receiving frame being sized and arranged relative to one another such that a process space bounded substantially by the atomization surface of the target body and the surrounding non-atomized residual interior surface, $F_9$, of the receiving frame, except for the receiving opening for the at least one workpiece, satisfies the relationship, $F_9 \leq 50\%$ $F_1$, to minimize the surrounding non-atomized residual interior surface and thereby to ensure, during an atomizing operation, a stable plasma discharge, comprising the step of providing storage disks with atomization coating.

* * * * *